United States Patent
Chen

(10) Patent No.: US 10,393,911 B2
(45) Date of Patent: Aug. 27, 2019

(54) NUCLEAR MAGNETIC RESONANCE (NMR) INTERECHO INTERVAL CONTROL METHODS AND SYSTEMS

(71) Applicant: HALLIBURTON ENERGY SERVICES, INC., Houston, TX (US)

(72) Inventor: Songhua Chen, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 308 days.

(21) Appl. No.: 14/781,884

(22) PCT Filed: Apr. 19, 2013

(86) PCT No.: PCT/US2013/037403
§ 371 (c)(1),
(2) Date: Oct. 1, 2015

(87) PCT Pub. No.: WO2014/171951
PCT Pub. Date: Oct. 23, 2014

(65) Prior Publication Data
US 2016/0033671 A1    Feb. 4, 2016

(51) Int. Cl.
*G01V 3/32*         (2006.01)
*G01V 3/34*         (2006.01)
*G01R 33/44*        (2006.01)
*G01R 33/561*       (2006.01)

(52) U.S. Cl.
CPC .............. *G01V 3/32* (2013.01); *G01R 33/44* (2013.01); *G01V 3/34* (2013.01); *G01R 33/5617* (2013.01)

(58) Field of Classification Search
CPC ............ G01V 3/32; G01V 3/34; G01R 33/44; G01R 33/5617; G01N 24/081
See application file for complete search history.

(56) References Cited

U.S. PATENT DOCUMENTS

| | | | | |
|---|---|---|---|---|
| 5,010,300 A | * | 4/1991 | Paley | G01R 33/4838 324/309 |
| 5,168,227 A | | 12/1992 | Foo et al. | |
| 6,366,087 B1 | | 4/2002 | Coates et al. | |
| 2003/0016013 A1 | | 1/2003 | Kruspe et al. | |

(Continued)

FOREIGN PATENT DOCUMENTS

WO    2014/171951    10/2014

OTHER PUBLICATIONS

PCT International Search Report and Written Opinion, dated Aug. 9, 2013, Appl No. PCT/US2013/037403, "Nuclear Magnetic Resonance (NMR) Interecho Interval Control Methods and Systems", filed Apr. 19, 2013, 17 pgs.

(Continued)

*Primary Examiner* — Manuel L Barbee
(74) *Attorney, Agent, or Firm* — Gilliam IP PLLC

(57) ABSTRACT

A nuclear magnetic resonance (NMR) logging tool includes a pulsed magnetic field source which provides an NMR logging pulse sequence having a reduced interecho interval (TE). A controller in communication with the pulsed magnetic field source provides a pulse sequence designed to substantially align an echo peak with a measurement deadtime boundary, yielding a partial spin echo data recovery which is at least partially compensated by a substantially higher measurement density.

22 Claims, 6 Drawing Sheets

(56) References Cited

U.S. PATENT DOCUMENTS

| | | | |
|---|---|---|---|
| 2003/0085702 A1* | 5/2003 | Freed | G01R 33/4625 |
| | | | 324/303 |
| 2004/0008027 A1* | 1/2004 | Prammer | G01N 24/081 |
| | | | 324/303 |
| 2004/0041562 A1* | 3/2004 | Speier | G01V 3/32 |
| | | | 324/303 |
| 2004/0222791 A1 | 11/2004 | Chen | |

OTHER PUBLICATIONS

GCC Examination Report, dated Mar. 28, 2017, Appl No. 2014-26788, "Nuclear Magnetic Resonance (NMR) Interecho Interval Control Methods and Systems," Filed Mar. 16, 2014.

Casanova, Frederico, et al., "NMR in Inhomogeneous Fields," Single-Sided NMR, 2011, pp. 11-56, Springer-Verlag Berlin Heidelberg.

CA Examination Report, dated Sep. 29, 2016, Appl No. 2,905,805, "Nuclear Magnetic Resonance (NMR) Interecho Interval Control Methods and Systems," Filed Mar. 16, 2014.

AU Examination Report, dated Dec. 15, 2015 Nuclear Magnetic Resonance (NMR) Interecho Interval Control Methods and Systems filed Apr. 19, 2013 Appln No. 2013386824.

* cited by examiner

NUCLEAR MAGNETIC RESONANCE (NMR) INTERECHO INTERVAL CONTROL METHODS AND SYSTEMS

BACKGROUND

Understanding the structure and properties of geological formations can improve the efficiency of oil field operations such as drilling, well completion, and production. The collection of information relating to conditions downhole, commonly referred to as "logging," can be performed by several methods including nuclear magnetic resonance (NMR) logging.

NMR logging tools operate by using an imposed static magnetic field, $B_0$, to give nuclei with non-zero nuclear spin (non-zero magnetic moment and angular momentum) split energy levels. Since lower energy levels are preferred, an ensemble of nuclei will exhibit an anisotropic distribution of energy states, giving the nuclear spins a preferential polarization parallel to the imposed field. This state creates a net magnetic moment and produces a bulk magnetization. The nuclei converge upon their equilibrium alignment with a characteristic exponential relaxation time constant. When this convergence occurs after the nuclei have been placed in a cooperative initial state (discussed below), it is known as recovery. The time constant for recovery is called the "spin-lattice" or "longitudinal" relaxation time $T_1$.

During or after the polarization period, the tool applies a perturbing field, usually in the form of a radio frequency electromagnetic pulse whose magnetic component, $B_1$, is perpendicular to the static field $B_0$. This perturbing field moves the orientation of the magnetization into the transverse (perpendicular) plane. The frequency of the pulse can be chosen to target specific nuclei (e.g., hydrogen). The polarized nuclei are perturbed simultaneously and, when the perturbation ends, they precess around the static magnetic field gradually re-polarizing to align with the static field once again while losing coherence in the transverse plane ($T_2$ relaxation). The precessing nuclei generate a detectable radio frequency signal that can be used to measure statistical distributions of $T_1$, $T_2$, porosities, and/or diffusion constants. To recover NMR measurements, data sampling is performed during a pulse sequence that generates repeated spin echoes. The data sampling process is limited by timing constraints of the receiver electronics as well as timing criteria of the NMR experiment.

BRIEF DESCRIPTION OF THE DRAWINGS

Accordingly, there are disclosed herein various nuclear magnetic resonance (NMR) interecho interval (TE) control methods and systems offering relatively faster data acquisition and improved measurements of short time constants.

Figure 1:
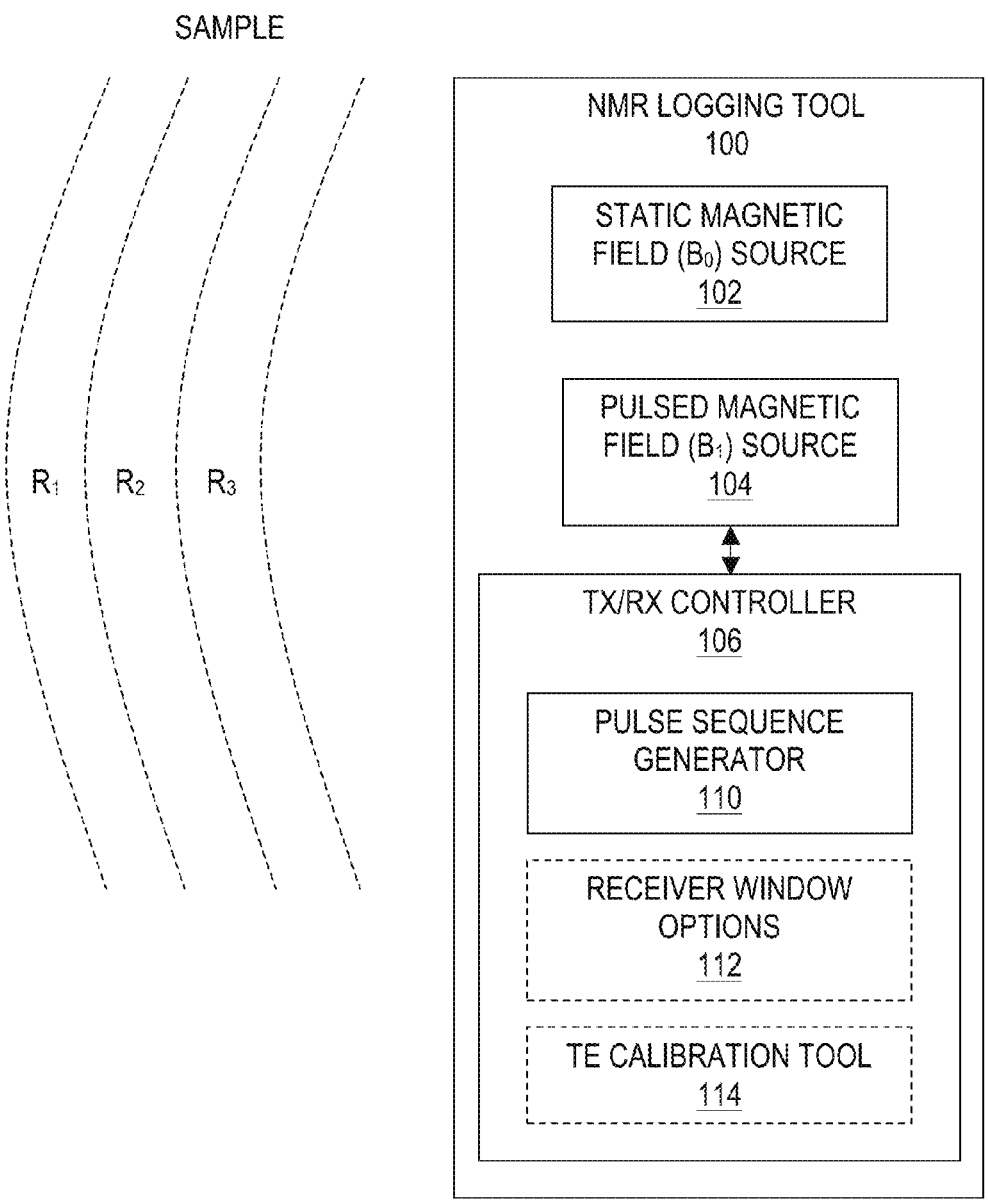
FIG. 1 is a block diagram of an illustrative NMR logging tool.

It should be understood, however, that the specific embodiments given in the drawings and detailed description below do not limit the disclosure. On the contrary, they provide the foundation for one of ordinary skill to discern the alternative forms, equivalents, and other modifications that are encompassed in the scope of the appended claims.

DETAILED DESCRIPTION

The following disclosure presents nuclear magnetic resonance (NMR) logging tools, systems, and methods that control the interecho interval (TE) to provide faster data acquisition and improved measurements of fast-relaxation components. As used herein, an "interecho interval" refers to the interval between spin echoes, which interval is controlled by the timing of pulses in the pulse sequence used to generate the spin echoes. The minimum TE achievable by an NMR logging tool depends on multiple factors including pulse shape, pulse width ($t_{pw}$), measurement deadtime ($t_{delay}$), and receiver window size ($t_{rv}$). The value of $t_{pw}$ is controlled by the available radio frequency (RF) peak power and the pulse shape. These values are fixed once the hardware, the operation frequencies, and the operation environment are given. The value of $t_{delay}$ corresponds to a measurement deadtime determined by ringing suppression limitations of the electronics used for pulse transmission and spin echo listening operations. The usual relationship between TE, $t_{delay}$, $t_{rv}$, and $t_{pw}$ can be expressed as:

$$TE \geq t_{pw} + 2t_{delay} + t_{rv} \quad (1)$$

FIG. 1 is a block diagram of an illustrative NMR logging tool 100. The NMR logging tool 100 includes a static magnetic field ($B_0$) source 102, such as one or more strong, permanent magnets (e.g., samarium cobalt magnets). The NMR logging tool 100 also includes a pulsed magnetic field ($B_1$) source 104 to emit pulses of an alternating radio frequency (RF) magnetic field using one or more antennas with suitable electronics. Note that such antennas and electronics can act in a dual role, also functioning to receive and detect spin echo signals. Alternatively such receiving can be done with separate antennas and electronics.

The NMR logging tool 100 further includes a transmitter/receiver (TX/RX) controller 106 coupled to the pulsed magnetic field source 104. In some embodiments, the TX/RX controller 106 includes a processor and a memory with executable software instructions. The TX/RX controller 106 directs the pulsed magnetic field source 104 to output a particular pulse sequence and to listen for NMR spin echo phenomena related to the pulse sequence. The TX/RX controller 106 includes a pulse sequence generator 110 that enables the TX/RX controller 106 to provide a pulse sequence to the pulsed magnetic field source 104 for NMR logging operations. The pulse sequence generator 110 has an internal clock such as a crystal oscillator. Pulse sequence variations are achieved by programming the pulse sequence generator 110 to vary the duration, phase, amplitude, shape, and duration of the pulses, as well as the time between each pulse. Thus, the pulse sequence generator 110 can be programmed to minimize TE or otherwise provide a suitable TE.

The TX/RX controller 106 employs receiver window options 112 as described herein to capture partial echo data (e.g., one side of each echo) during an echo train generated by a pulse sequence. The TX/RX controller 106 also employs a TE calibration module 114 to test different pulse sequences and receiver window options 112 and to select the option that minimizes the TE while still ensuring spin echo data is adequately recovered.

In an alternative embodiment, which is discussed in greater detail below, the TX/RX controller 106 includes a control interface that receives pulse sequence instructions or commands from a remote computer and directs the pulsed magnetic field source 104 to transmit and receive accordingly. That is, the TX/RX controller 106 is able to direct switches, power supplies, or other electronics for the pulsed magnetic field source 104 in accordance with pulse sequence generator 110 options and the receiver window options 112, each of which can be determined and changed by a remote computer, communicated to the tool 100, and stored for use by the controller 106.

During the calibration process, the TX/RX controller 106 may perform various processing and analysis operations in accordance with instructions from the TE calibration module 114, or may simply operate on commands received from a local or remote computer tasked with performing TE calibration processing and analysis. The decision to perform TE calibration processing/analysis operations locally or remotely may be based on preference or limitations with regard to the amount of downhole processing, the bandwidth and data rate for data transmissions between the NMR logging tool 100 and a remote computer, the durability of downhole components, or other criteria.

Regardless of whether TE calibration operations are implemented locally or remotely, the receiver window options 112 enable partial spin echo data to be recovered. Further, the TE calibration module 114 enables testing of different receiver window options 112 to determine which option minimizes the TE while still ensuring spin echo data is recovered. In some scenarios, a reduced TE rather than a minimum TE is preferred, depending on the logging task or downhole environment.

The TE calibration operations described herein (e.g., testing and selecting pulse sequence options and/or receiver window options) may be performed at different times. For example, TE calibration operations may be performed as part of the design process for the NMR logging tool 100. In other embodiments, TE calibration operations may be performed just before the NMR logging tool 100 is lowered into a downhole environment, while the NMR logging tool 100 is in a downhole environment, and/or after the NMR logging tool 100 is removed from a downhole environment. Further, TE calibration operations may be performed in response to an environmental trigger. For example, the TX/RX controller 106 may perform TE calibration operations if the temperature in a downhole environment changes by more than a threshold amount. As another example, the TX/RX controller 106 may perform TE calibration operations at different downhole depths or formations.

The NMR experiment performed by he NMR logging tool 100 uses $B_0$ and $B_1$ to act on the nuclear magnetic spins of a sample and create a detectable spin echo phenomenon. Peaks in the NMR spin echo responses are the result of refocusing the spin magnetic moments. Due to the physics of the echo generation process, the $n^{th}$ spin echoes are formed at the time of $t_n = nTE$ (where time t is measured from the beginning of the pulse sequence). Each peak is substantially symmetric, with the decay envelope before each peak time $t_n$ being essentially the time reverse of the trailing decay envelope. As far as the desired measurements are concerned, the left and right halves of a spin echo carry the same information, and either half of a spin echo can be used to derive the wanted information (e.g., formation fluid and rock properties).

Figure 2A:
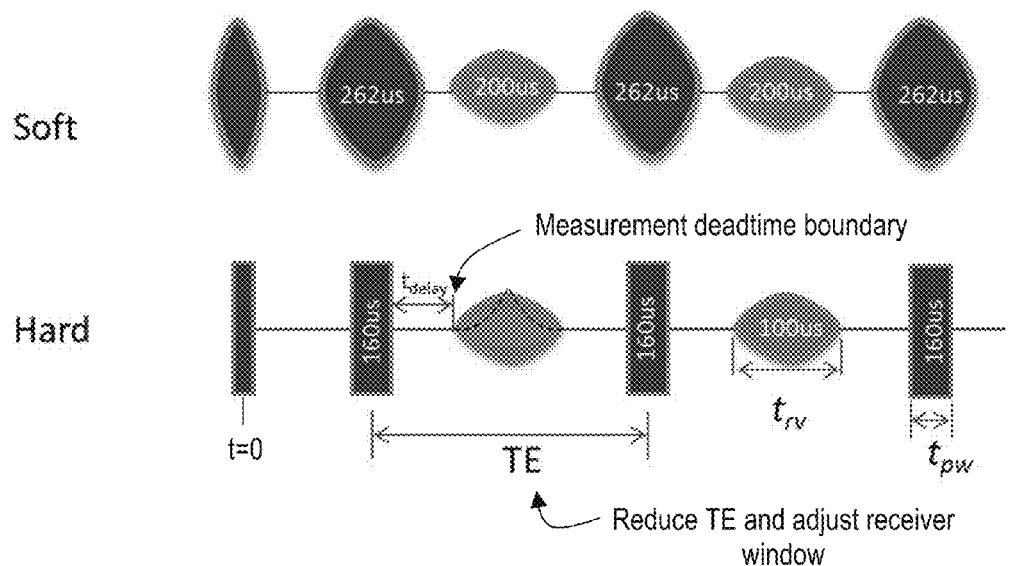
FIGS. 2A-2E show illustrative pulse sequence and receiver window options.

FIGS. 2A-2E show illustrative pulse and receiver window sequences. FIG. 2A compares two pulse sequences, the first of which employs "soft" (shaped) pulses, where each pulse has, as an example, a pulse width $t_{pw}$ of 262 μs. Between the soft pulses are receiver windows having, e.g., window widths of $t_{rv}$ of 200 μs. In contrast, the bottom pulse sequence employs "hard" (rectangular) pulses. Such pulses, while closer to a theoretical ideal, are more demanding on the electronics and, due to their increased frequency content, may actually increase the required deadtime $t_{delay}$ relative to that required for soft pulse sequences. The illustrative hard pulse sequence employs an illustrative pulse width $t_{pw}$ of 160 μs and illustrative receiver window widths $t_{rv}$ of 100 μs. The subsequent discussions will focus on hard pulse sequences for ease of explanation, but it is understood that the discussion also applies when soft pulse sequences are employed.

In FIG. 2A, the represented TE enables full spin echo data recovery. In other words, the spin echo (shown in dashed lines) and receiver window are aligned and each start after the measurement deadtime boundary. If a shorter TE is preferred, the measurement deadtime boundary may be used as a guideline. For example, the minimum TE represented in FIGS. 2B and 2C is expressible as:

$$TE \geq t_{pw} + 2t_{delay}, \quad (2)$$

or approximately equal to double the deadtime. The spin echo peak is approximately aligned with the measurement deadtime boundary. When such a reduced TE is employed, various receiver window options are available to enable partial spin echo data recovery, i.e., the receiver windows may vary in shape, duration, and position.

Figure 2B:
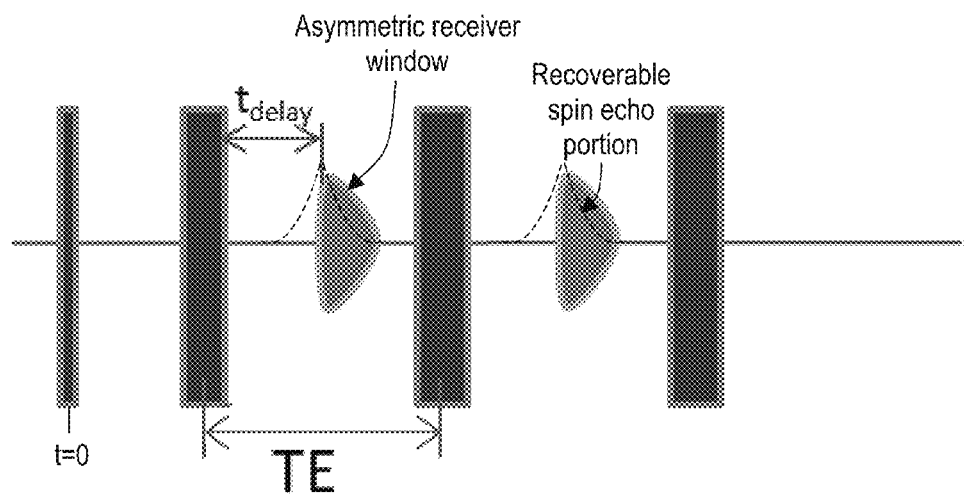
Figure 2C:
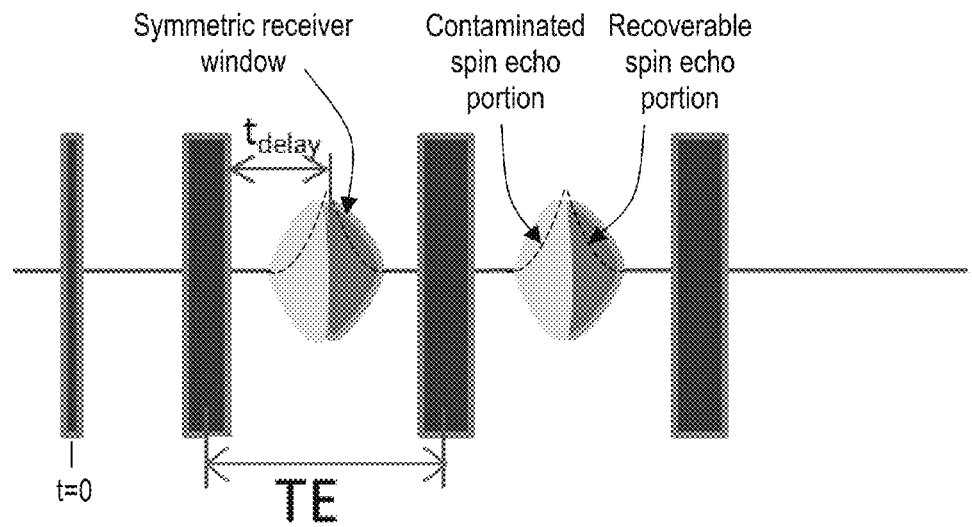

FIG. 2B illustrates the use of asymmetric receiver windows. The beginning of each asymmetric receiver window of FIG. 2B is aligned with a measurement deadtime boundary to recover partial spin echo data (i.e., the second half of each spin echo corresponding to a recoverable spin echo portion). More specifically, the peak of each asymmetric receiver window is approximately aligned with the measurement deadtime boundary, in alternative embodiments, the beginning of each asymmetric receiver window or the peak of each asymmetric receiver window may be offset from a measurement deadtime boundary by a predetermined amount based on calibration results or other performance estimates.

The asymmetric window ($f'_{rv}$) may be defined, for example, as the right half of a symmetric receiver window by:

$$f'_{rv} = \begin{cases} 0, & t_n - (t_{rv}/2) \leq t \leq t_n \\ f_{rv}, & t_n < t \leq t_n + (t_{rv}/2) \end{cases}, \quad (3)$$

where $f_{rv}$ is the same receiver window function as a symmetric receiver window in a defined time interval. With this modification and assuming the same $t_{delay}$, TE can be reduced by $t_{rv}$ (compared to the configuration of FIG. 2A). Assuming $t_{rv} = 100$ μs, a reduction of this amount in TE is significant. The TE reduction of $t_{rv}$ corresponds to a reduction of $t_{rv}/2$ between the pulse and the center of the spin echo, and the same amount of reduction between the center of the spin echo and the next pulse. In other words, in order to shift the spin echo position by $t_{rv}/2$ as in FIG. 2B (relative to FIG. 2A), a reduction in TE of $t_{rv}$ is needed.

Although a smaller receiver window results in less signal recovery, it also decreases the total amount of noise included in the signal recovery process. The collective result is the reduction of signal-to-noise ratio (SNR) by a factor of 29.3% if only a single echo is considered. On the other hand, with the reduction of TE, more echo signals can be acquired within an echo train, thus partially compensating for the reduction of signal recovery in a single echo train. For example, if TE is reduced from 0.3 ms to 0.2 ms and the data sampling density is thereby increased by 50%, the effective SNR is improved by $\sqrt{1.5}=1.225$. The overall SNR, when considering both the 0.293 reduction and 1.225 increase, is a mere reduction of 0.13. For this small reduction in the overall SNR, a smaller TE can be utilized, which enables analysis of rock formations having very fast relaxation components. Such components could be completely invisible to tools using larger TE pulse sequences.

FIG. 2C illustrates the use of symmetric receiver windows in a reduced-TE pulse sequence. As shown, the center of each symmetric receiver window is aligned with a measurement deadtime boundary, resulting in recovery of partial spin echo data (i.e., the second half of each echo is the recoverable spin echo portion). With the configuration of FIG. 2C, the left side of each symmetric receiver window overlaps with the measurement deadtime, while the right side of each symmetric receiver is able to recover the second half of an echo. In FIG. 2C, the center of each symmetric receiver window corresponds to the deadtime boundary. In alternative embodiments, the centers and/or peaks of symmetric receiver windows are offset from measurement deadtime boundaries by a predetermined amount based on calibration results or other performance estimates.

In FIG. 2C, the receiver windows start to open before the completion of $t_{delay}$ such that $t_{delay}$ ends at the center of the window. Accordingly, the first half of the echo signal in this scenario may be contaminated by a higher-level of residual ringing and thus would be excluded in subsequent processing of the recovered spin echo data. Regardless, the receiver window option of FIG. 2C may have an improved performance compared to the option of FIG. 2B since imperfections in the rise time of the receiver windows can affect signal recovery in the scheme of FIG. 2B more than in the scheme of FIG. 2C. Also, the receiver window option of FIG. 2C enables part of the contaminated half of the spin echo signal to be included in further processing to recover spin echo data if interference (e.g., ringing) during the measurement deadtime is below a threshold level.

Figure 2D:
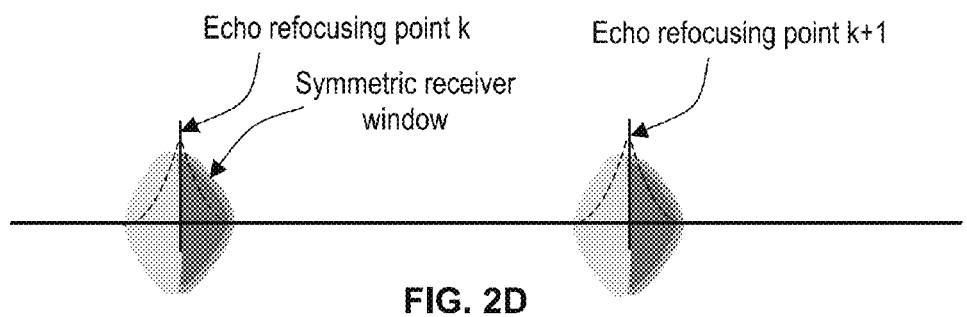
Figure 2E:
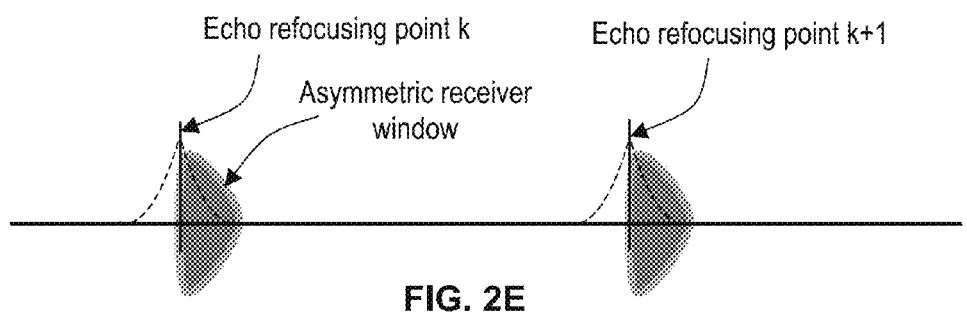

FIG. 2D further illustrates the preferred alignment of symmetric receiver windows with the refocusing peaks of the echo signals, i.e., the echo peaks and receiver windows are center-aligned and peak-aligned. FIG. 2E similarly illustrates the preferred alignment for asymmetric receiver windows, i.e., the echo peaks and asymmetric receiver windows are peak-aligned, with the echo peaks' centers substantially aligned with the left side of the asymmetric receiver window. In FIGS. 2D and 2E, the receiver windows are approximately centered between the two $\pi$ pulses to take advantage of the strongest signal. For a logging tool with a strong magnetic field gradient, the echo decay time is controlled dominantly by the gradient strength, so $T_2^*$ (decay of transverse magnetization) is proportional to $1/\gamma G$, where G is the tool gradient and $\gamma$ is the gyromagnetic ratio that relates the magnetic field strength to the NMR frequency. The echo amplitude around the $k^{th}$ refocusing point kTE can be estimated and is expressed as:

$$E_0 \exp(-|t-kTE|/T_2^*) \quad (4)$$

The ringing attenuation that follows pulses of a pulse sequence can also be expressed by an exponential function. Assuming the attenuation constant is $\Delta$, the ringing can be expressed as a function of time in the form of:

$$B \cdot \exp\left(-\left|t-\left(k-\frac{1}{2}\right)TE-\frac{\tau_\pi}{2}\right|\Big/\Delta\right) \quad (5)$$

$$\text{for } \left(k-\frac{1}{2}\right)TE+\frac{\tau_\pi}{2} \leq t \leq \left(k+\frac{1}{2}\right)TE-\frac{\tau_\pi}{2},$$

where B is the initial ringing amplitude and $\tau_x$ is the refocusing pulse length (note the refocusing pulse does not necessarily have a tipping angle of $\pi$). Comparing the amplitude of Eq. (4) and Eq. (5), an optimal time for the onset of a receiver window is established. For example, the onset $t=t'$ can be determined by $$\frac{E_0 \exp(-|t-kTE|/T_2^*)}{B \cdot \exp\left(-\left|t-\left(k-\frac{1}{2}\right)TE-\frac{\tau_\pi}{2}\right|\Big/\Delta\right)} \geq p, \quad (6)$$

where p is a predetermined criteria value.

In some embodiments, the receiver window is further modified to extend asymmetrically in time and/or shape around the echo refocusing point kTE. In such embodiments, the same criteria described in Eq. (6) can be used to determine the onset of the receiver window. In other words, the receiver window may be symmetric or asymmetric around t=kTE so long as the trailing edge of the receiver window t'' (i.e., t''−kTE) is greater than TE−t'. The example receiver window options described herein are not intended to limit receiver windows to a particular shape or position, and those familiar with NMR pulse sequence design and data acquisition will appreciate that other window shape functions are possible.

In accordance with at least some embodiments, the TX/RX controller 106 (FIG. 1) determines which receiver window option 112 (e.g., shape and position) is preferred for a given logging scenario to recover partial spin echo data. The TE calibration criteria may be for a minimum TE or a predetermined TE for a given formation. However, the logging tool 100 is part of a larger logging system and the calibration or other determination of receiver window options may be performed remotely from the tool.

Figure 3:
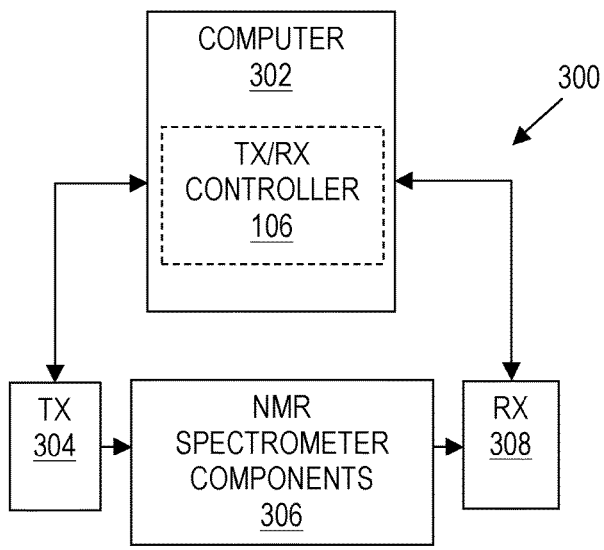
FIG. 3 is a block diagram of an illustrative NMR logging system.

FIG. 3 shows a block diagram of an illustrative NMR logging system 300. The NMR logging system 300 includes a computer 302 that, in at least some embodiments, directs the operations of TX/RX controller 106. In such embodiments, the remote computer stores and executes instructions to enable NMR logging with a minimal TE or calibration-based TE as described herein. The computer 302 is configured to provide commands, programming, and/or data to a transmitter 304. The transmitter 304 may include a programmable pulse sequence device or storage, a radio frequency (RF) synthesizer, a phase shifter, a pulse gate, an amplifier, and/or other components to control the pulsed magnetic field for NMR logging operations including the TE calibration operations described herein. In different embodiments, the TX/RX controller 106 enables adjustment of pulse sequences and utilization of different receiver window options based on a default configuration, user selection, and/or calibration. In short, the transmitter 304 is configured to output a pulse sequence with a calibration-based TE as described herein.

The NMR logging system 300 also includes NMR spectrometer components 306 used for NMR logging operations. Examples of NMR spectrometer components 306 include one or more magnets, shim coils, probes/antennas, and/or field-frequency lock components. Further, the NMR spectrometer components 306 may include a duplexer that enables separation between transmission current and reception current. The receiver 308 of NMR logging system 300 is configured to receive and decode NMR signals. The receiver 310 may include 5 an analog-to-digital converter (ADC), filters, mixers, splitters, pre-amplifiers, and/or other components to receive NMR signals and recover measurement data. In accordance with embodiments, receiver 310 is configured to recover partial spin echo data using receiver window options as described herein. The recovered measurement data is output from the receiver 308 to computer 302 for 10 storage and analysis. Thus, the computer 302 may communicate with the transmitter 304 and the receiver 308 of system 300 to enable NMR logging operations in which pulse sequences have a reduced TE and one or more receiver windows options are employed to recover partial spin echo data.

Figure 4:
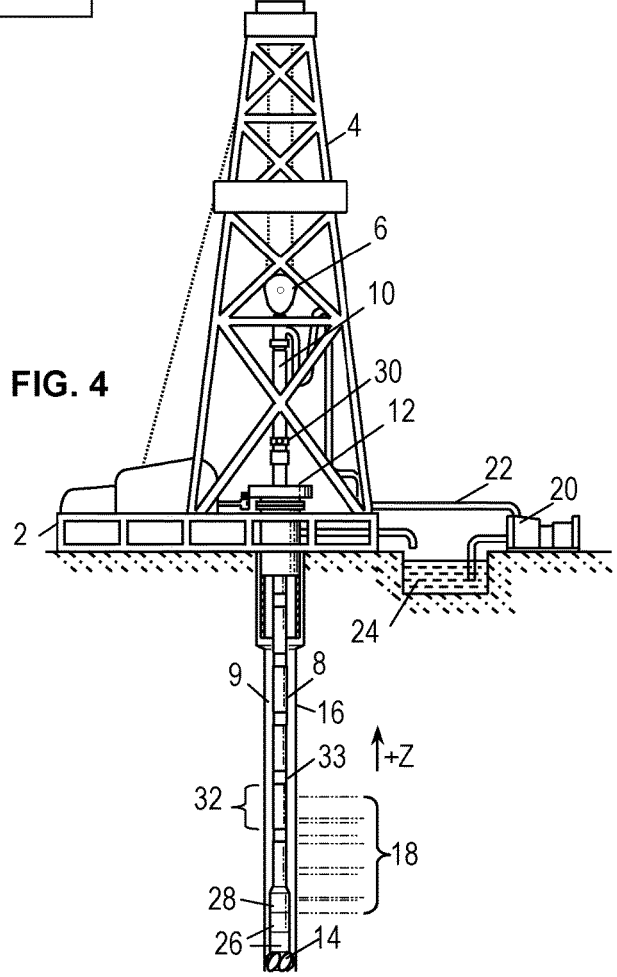
FIG. 4 shows an illustrative logging while drilling (LWD) environment.

FIG. 4 shows an illustrative logging while drilling (LWD) environment, which serves as an exemplary usage context for the NMR logging systems described above. A drilling platform supports a derrick 4 having a traveling block 6 for raising and lowering a drill string 8. A drill string kelly 10 supports the rest of the drill string 8 as it is lowered through a rotary table 12. The rotary table 12 rotates the drill string 8, thereby turning a drill bit 14. As bit 14 rotates, it creates a borehole 16 that passes through various formations 18. A pump 20 circulates drilling fluid through a feed pipe 22 to kelly 10, downhole through the interior of drill string 8, through orifices in drill bit 14, back to the surface via the annulus 9 around drill string 8, and into a retention pit 24. The drilling fluid transports cuttings from the borehole 16 into the pit 24 and aids in maintaining the integrity of the borehole.

The drill bit 14 is just one piece of an open-hole LWD assembly that includes one or more drill collars 26 and logging tools 28, 32. Drill collars 26 are thick-walled steel pipe sections that provide weight and rigidity for the drilling process. The logging tools 28, 32 (some of which may be built in to the drill collars) gather measurements of various drilling or formation parameters. Either of logging tools 28, 32 may include an NMR logging tool configured to perform and/or be directed by the calibration techniques described herein. Measurements from the logging tools 28, 32 can be acquired by a telemetry sub (e.g., built in to logging tool 28) to be stored in internal memory and/or communicated to the surface via a communications link. Mud pulse telemetry is one common technique for providing a communications link for transferring logging measurements to a surface receiver 30 and for receiving commands from the surface, but other telemetry techniques can also be used.

At various times during the drilling process, the drill string 8 may be removed from the borehole 16 as shown in FIG. 2. Once the drill string 8 has been removed, logging operations can be conducted using a wireline logging string 34 (i.e., an assembly of wireline logging tools suspended by a cable 42 having conductors for transporting power to the tools and telemetry from the tools to the surface). It should be noted that various types of formation property sensors can be included with the wireline logging sonde 34. For example, the illustrative wireline logging sonde 34 includes logging tool 32, which may correspond to an NMR logging tool configured to perform and/or be directed by the reduced TE techniques described herein. The logging tool 32 may be coupled to other modules of wireline logging sonde 34 by one or more adaptors 33.

Figure 5:
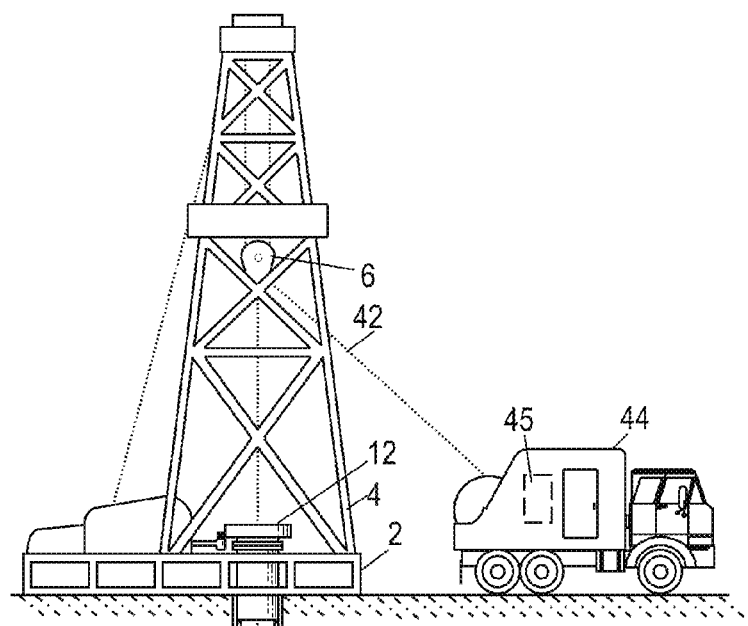
FIG. 5 shows an illustrative wireline logging environment.
Figure 5:
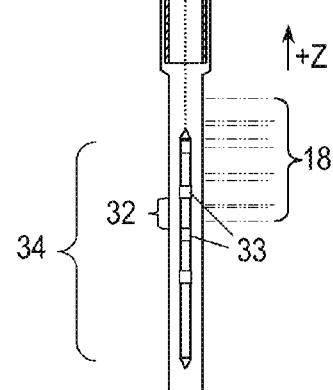

A wireline logging facility 44 collects measurements from the logging tool 32, and includes computing facilities 45 for managing logging operations, acquiring and storing the measurements gathered by the wireline logging sonde 34, and optionally processing the measurements for display to a user. For the logging environments of FIGS. 4 and 5, measured parameters can be recorded and displayed in the form of a log, i.e., a two-dimensional graph showing the measured parameter as a function of tool position or depth.

Figure 6:
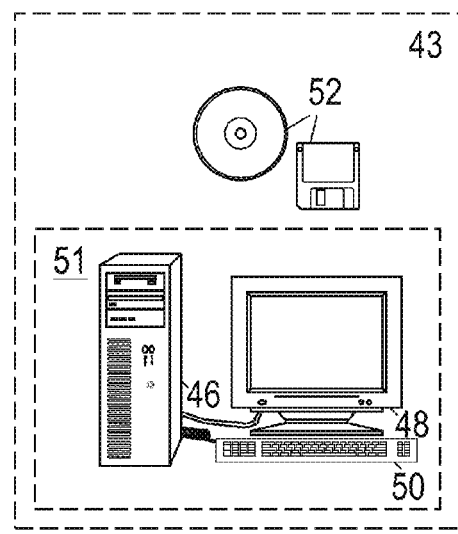
FIG. 6 shows an illustrative computer system for managing logging operations.

FIG. 6 shows an illustrative computer system 43 for managing logging operations. The computer system 43 may correspond to, e.g., an onsite logging facility for the drilling rig of FIG. 4, the computing facilities 45 of the wireline logging facility 44 of FIG. 5, or a remote computing system that receives logging measurements from such logging facilities. The computer system 43 may include wired or wireless communication interfaces receiving such logging measurements. As shown, the illustrative computer system 43 includes user workstation 51 with a computer chassis 46 coupled to a display device 48 and a user input device 50. The computer chassis 46 includes one or more information storage devices for accessing software (shown in FIG. 5 in the form of removable, non-transitory information storage media 52) that configures the computer system to interact with a user, enabling the user to process the logging data and, in the case of local logging facilities, to manage logging operations including analyzing borehole conditions. The software may also be downloadable software accessed through a network (e.g., via the Internet). In some embodiments, illustrative computer system 43 executes software that performs the TE control techniques described herein and/or directs logging operations of a NMR logging tool (e.g., NMR logging tool 100 or 32) using the disclosed TE control techniques.

In some embodiments, the computer system 43 includes a non-transitory computer readable medium with a TE control software tool. The software tool, when executed, causes a processor of the computer system 43 to test or select a pulse sequence and receiver window options to recover partial echo data as described herein. In some embodiments, the TE control tool may cause the processor to test different receiver window options for a selected pulse sequence. Further, the TE control tool may cause the processor to align receiver window peaks with measurement deadtime boundaries or with echo refocusing points as described herein.

Figure 7:
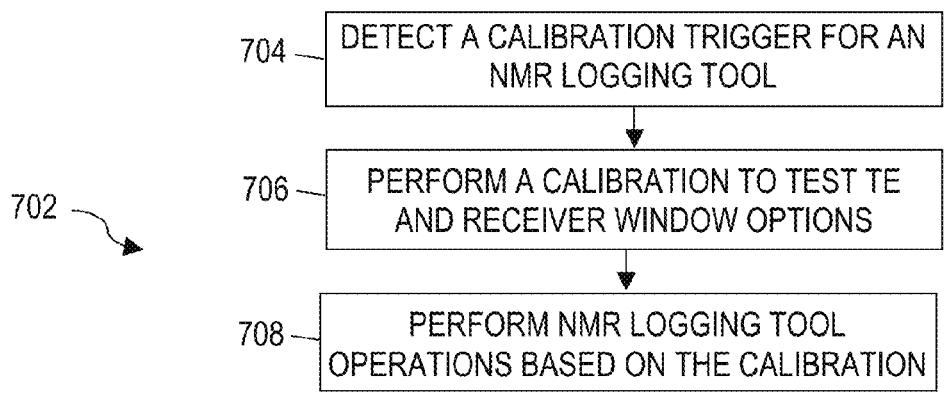
FIGS. 7-8 are flowcharts for an illustrative logging method.

FIG. 7 is a flowchart for an illustrative NMR logging method 702. In method 702, a calibration trigger for an NMR logging tool is detected (block 704). As an example, the calibration trigger may correspond to a manual trigger, a schedule-based trigger, and/or an environmental trigger (e.g., a time-based, temperature-based or depth-based trigger). In response to the calibration trigger, a calibration is performed to test TE and receiver window options (block 706). For example, the calibration may be to minimize TE (e.g., by determining a TE that aligns a spin echo peak with a measurement deadtime boundary) or simply to reduce TE by a predetermined amount (e.g., the current width of the receiver window).

In some embodiments, an asymmetric receiver window option is selected to recover partial spin echo data. Further, in some embodiments, receiver window peaks and spin echo peaks are aligned with or are offset from measurement deadtime boundaries. The amount of the offset may be determined by a calibration or operator preferences. In some embodiments, receiver windows partially overlap with measurement deadtimes. Further, in some embodiments, receiver window peaks are aligned with or are offset from echo refocusing points. Again, the amount of the offset may be determined by a calibration or operator preferences. In some embodiments, TE calibration operations are performed to determine a minimum TE that enables NMR signal recovery, where receiver window parameters are determined based on the calibration. TE calibration operations may result in a plurality of TE values and receiver window options that are stored as optional control parameters or scenario specific control parameters. These stored TE values and/or stored receiver window options may be available for selection as needed during logging operations.

NMR logging tool operations are then performed based on the calibration (block 708). In at least some embodiments, the calibration may determine parameter values for the pulse sequence. For example, the calibration may determine one or more of pulse frequency, pulse width, pulse amplitude, onset time t' (width of the receiver window preceding the echo peak), trailing time t" (width of the window after the echo peak), window shape $f_{rv}$, and TE.

In some embodiments, the process of determining a minimum TE and selecting receiver window options is performed during a pulse sequence design process, where the limitations of logging tool electronics and hardware are tested by experiments. For each TE and/or receiver window option, a separate test may be performed to determine logging tool performance. The testing may result in a default TE and receiver window option for a particular logging tool. The testing also may enable a plurality of TE values and receiver window options to be stored as optional control parameters or scenario specific control parameters. Thus, the calibration operations of method 700 may involve selection of one of these stored TE values and/or stored receiver window options for a particular logging tool, whose electronics were previously tested outside of the downhole environment or in another downhole environment.

Figure 8:
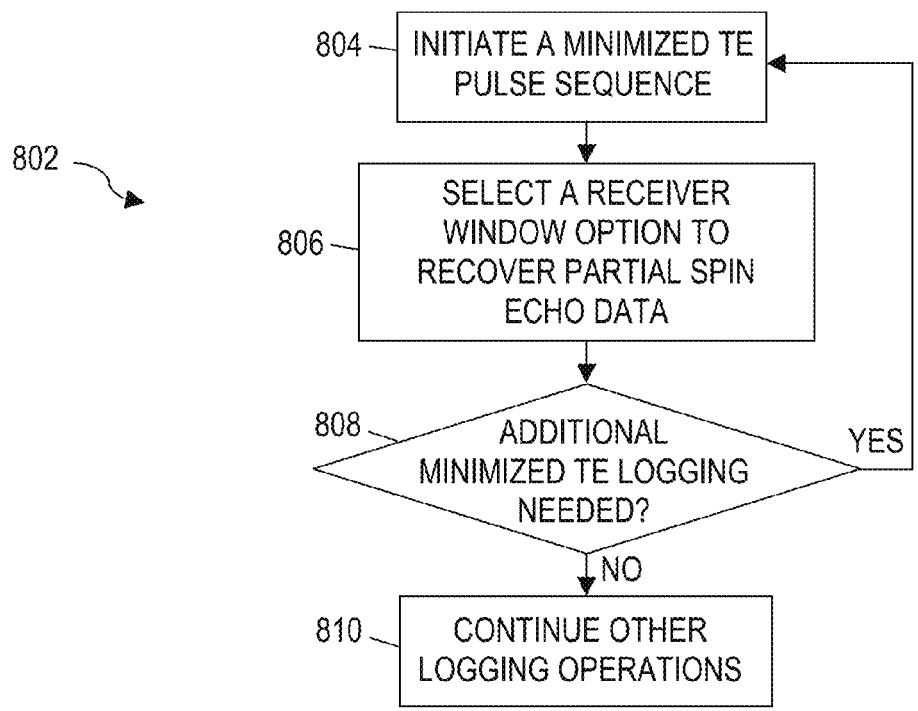

FIG. 8 is a flowchart of a method 802 representing some of the operations represented by block 708 in greater detail. The method 802 may be performed after a calibration is performed, or at other times to perform NMR logging using TE control techniques as described herein. At block 804, a minimized TE pulse sequence is initiated. The minimized TE pulse sequence may align spin echo peaks with (or offset spin echo peaks from) measurement deadtime boundaries such that only partial spin echo data is recoverable. At block 806, a receiver window option is selected to recover partial echo data during an echo train related to the minimized TE pulse sequence. If additional minimized TE logging is needed (determination block 808), the method 802 returns to block 804. Otherwise, the method 802 proceeds to block 810 to continue other logging operations. Such logging operations may include stacking of the (partial response) echo trains, processing to extract the T1 and T2 distributions, and further analysis to derive relevant formation parameters from such distributions. Logs displaying any or all of the foregoing can be displayed by computer 43 to a user.

Numerous other variations and modifications will become apparent to those skilled in the art once the above disclosure is fully appreciated. It is intended that the following claims be interpreted to embrace all such variations and modifications where applicable.

What is claimed is:

1. A nuclear magnetic resonance (NMR) logging tool, comprising:
    a pulsed magnetic field source; and
    a controller in communication with the pulsed magnetic field source to provide a pulse sequence to generate a plurality of spin echoes each separated by an interecho interval (TE) selected to align a spin echo peak with a measurement deadtime boundary, wherein the controller includes an asymmetric receiver window which is positioned asymmetrically with respect to the spin echo peak, wherein the asymmetric receiver window is only open for a portion of each of the plurality of spin echoes.

2. The NMR logging tool of claim 1, wherein the controller employs the asymmetric receiver window to recover partial spin echo data.

3. The nuclear magnetic resonance (NMR) logging tool of claim 2, wherein a same asymmetric receiver window is applied to recover the plurality of spin echoes.

4. The nuclear magnetic resonance (NMR) logging tool of claim 2, wherein the asymmetric receiver window suppresses residual ringing of the plurality of spin echoes.

5. The NMR logging tool of claim 1, wherein the controller aligns an asymmetric receiver window peak with the spin echo peak to recover partial echo data.

6. The NMR logging tool of claim 1, wherein the controller offsets an asymmetric receiver window peak from a measurement deadtime boundary by a predetermined amount.

7. The NMR logging tool of claim 1, wherein the controller partially overlaps the asymmetric receiver window with a measurement deadtime.

8. The NMR logging tool of claim 1, wherein the controller aligns an asymmetric receiver window peak with an echo refocusing point.

9. The NMR logging tool of claim 1, wherein the controller offsets an asymmetric receiver window peak from an echo refocusing point by a predetermined amount.

10. The NMR logging tool of claim 1, wherein the controller selects one of a plurality of stored TE values and one of a plurality of stored receiver window options.

11. The nuclear magnetic resonance (NMR) logging tool of claim 1, wherein the interecho interval (TE) is further selected based on an environmental trigger or depth.

12. A nuclear magnetic resonance (NMR) method, comprising:
    providing a pulse sequence to generate a plurality of spin echoes each separated by an interecho interval (TE) selected to align a spin echo peak with a measurement deadtime boundary; and
    using a receiver window that recovers partial spin echo data, wherein the receiver window is an asymmetric receiver window which is positioned asymmetrically with respect to the spin echo peak, wherein the asymmetric receiver window is only open for a portion of each of the plurality of spin echoes to recover the partial spin echo data.

13. The NMR method of claim 12, further comprising aligning a receiver window peak with the spin echo peak to recover partial echo data.

14. The NMR method of claim 12, further comprising offsetting a receiver window peak from the measurement deadtime boundary by a predetermined amount.

15. The NMR method of claim 12, wherein using a receiver window comprises using a receiver window that overlaps with a measurement deadtime to recover partial echo data.

16. The NMR method of claim 12, further comprising aligning a receiver window peak with an echo refocusing point.

17. The NMR method of claim 12, further comprising offsetting a receiver window peak from an echo refocusing point by a predetermined amount.

18. The NMR method of claim 12, further comprising selecting one of a plurality of stored TE values and one of a plurality of stored receiver window options.

19. A non-transitory computer readable medium storing an interecho interval (TE) control software that, when executed, causes a processor to:
   select a pulse sequence to generate a plurality of spin echoes each separated by an interecho interval (TE) selected to align a spin echo peak with a measurement deadtime boundary; and
   select one of a plurality of receiver window options to recover partial spin echo data during a spin echo train related to the selected pulse sequence wherein the plurality of receiver window options includes an asymmetric receiver window which is positioned asymmetrically with respect to the spin echo peak, wherein the asymmetric receiver window is only open for a portion of each of the plurality of spin echoes to recover the partial spin echo data.

20. The non-transitory computer readable medium of claim 19, wherein the TE control software further causes the processor to test different receiver window options for the selected pulse sequence.

21. The non-transitory computer readable medium of claim 19, wherein the TE control software further causes the processor to align receiver window peaks with measurement deadtime boundaries.

22. The non-transitory computer readable medium of claim 19, wherein the TE control software further causes the processor to align receiver window peaks with echo refocusing points.

* * * * *